United States Patent
Yamamoto et al.

(10) Patent No.: US 11,444,694 B2
(45) Date of Patent: Sep. 13, 2022

(54) OPTICAL TRANSMISSION SYSTEM

(71) Applicant: NIPPON TELEGRAPH AND TELEPHONE CORPORATION, Tokyo (JP)

(72) Inventors: Shuto Yamamoto, Musashino (JP); Akira Masuda, Musashino (JP); Hiroki Taniguchi, Musashino (JP); Yoshiaki Kisaka, Musashino (JP)

(73) Assignee: NIPPON TELEGRAPH AND TELEPHONE CORPORATION, Tokyo (JP)

( * ) Notice: Subject to any disclaimer, the term of this patent is extended or adjusted under 35 U.S.C. 154(b) by 0 days.

(21) Appl. No.: 17/291,228

(22) PCT Filed: Nov. 6, 2019

(86) PCT No.: PCT/JP2019/043364
§ 371 (c)(1),
(2) Date: May 4, 2021

(87) PCT Pub. No.: WO2020/095916
PCT Pub. Date: May 14, 2020

(65) Prior Publication Data
US 2021/0367671 A1 Nov. 25, 2021

(30) Foreign Application Priority Data
Nov. 6, 2018 (JP) .............................. JP2018-208960

(51) Int. Cl.
*H04J 14/02* (2006.01)
*H04B 10/2507* (2013.01)
(Continued)

(52) U.S. Cl.
CPC ........ *H04B 10/2507* (2013.01); *H03M 13/41* (2013.01); *H04B 10/516* (2013.01); *H04B 10/61* (2013.01); *H04L 25/49* (2013.01)

(58) Field of Classification Search
CPC .. H04B 10/2507; H04B 10/516; H04B 10/61; H04B 10/524; H03M 13/41; H04L 25/49; H04L 25/4917
(Continued)

(56) References Cited

U.S. PATENT DOCUMENTS

2002/0154685 A1\* 10/2002 Olafsson ................. H04L 29/06
 375/222
2003/0126545 A1\* 7/2003 Tan ......................... H04L 1/006
 714/786
2004/0228419 A1 11/2004 Shen et al.

OTHER PUBLICATIONS

Joo Sung Park et al., A Spectral Shaping Nonlinear Binary Coded Modulation with Gray-Mapped QAM Signals, The 2010 Military Communications Conference—Unclassified Program—Waveforms and Signal Processing Track, 2010, pp. 2363-2368.
(Continued)

*Primary Examiner* — Don N Vo

(57) ABSTRACT

Provided is an optical transmission system that includes an optical transmitter, and an optical receiver. The optical transmitter includes: a signal coding unit configured to perform nonlinear trellis coding, which corresponds to nonlinear calculation, on a symbol sequence; and a modulator configured to modulate the symbol sequence subjected to the nonlinear trellis coding by the signal coding unit, and transmit the modulated symbol sequence to the optical receiver. The optical receiver includes: a light receiving unit configured to receive an optical signal transmitted from the optical transmitter, and convert the received optical signal into an electrical signal; and a digital signal processing unit
(Continued)

configured to perform digital signal processing on the electrical signal to reconstruct the symbol sequence.

6 Claims, 11 Drawing Sheets

(51) Int. Cl.
*H03M 13/41* (2006.01)
*H04B 10/516* (2013.01)
*H04B 10/61* (2013.01)
*H04L 25/49* (2006.01)

(58) Field of Classification Search
USPC .......................................... 375/265; 398/79
See application file for complete search history.

(56) References Cited

OTHER PUBLICATIONS

Shuto Yamamoto et al., 92-Gbaud PAM4 Transmission using Spectral-Shaping Trellis-Coded-Modulation with 20-GHz Bandwidth Limitation, 2019 Optical Fiber Communications Conference and Exhibition (OFC), Mar. 7, 2019.

* cited by examiner

OPTICAL TRANSMISSION SYSTEM

CROSS-REFERENCE TO RELATED APPLICATIONS

This application is a 371 U.S. National Phase of International Application No. PCT/JP2019/043364 filed on Nov. 6, 2019, which claims priority to Japanese Application No. 2018-208960 filed on Nov. 6, 2018. The entire disclosures of the above applications are incorporated herein by reference.

TECHNICAL FIELD

The present invention relates to an optical transmission system.

BACKGROUND ART

Following increasing demand for data communication, optical transmission networks that use optical signal modulation technologies and optical signal multiplexing technologies that enable transmission of a large amount of traffic are becoming popular. In particular, in ultrahigh speed optical transmission systems in which the transmission speed per wave is 100 Gbit/sec (hereinafter denoted as "Gb/s") or higher, a digital coherent technology, which is a combination of coherent detection and a digital signal processing technology, is widely used. On the other hand, with the popularization of high volume data communication represented by LTE (Long Term Evolution) in mobile terminals, there is demand for realizing ultrahigh speed optical transmission as fast as 100 Gb/s at a lower cost, that is, with a simpler device configuration for transmission and reception, when compared to that required by the above-described digital coherent technology.

As method for realizing ultrahigh speed optical transmission as fast as 100 Gb/s with a simple device configuration, direct wave detection methods in which a data signal is demodulated based on intensity information regarding an optical signal are attracting attention. In particular, studies are carried out on an ultrahigh speed optical transmission method that uses PAM4 (4-level Pulse Amplitude Modulation), which is a four-value intensity modulation method having higher efficiency of use of frequencies when compared to a NRZ (Non Return-to-Zero) method, which is a binary intensity modulation signal.

In optical transmission as fast as 100 Gb/s that is performed using a digital coherent technology, a modulation method of polarization division multiplexing QPSK (Quadrature Phase Shift Keying) (hereinafter referred to as "PDM-QPSK" (Polarization Division Multiplexing-QPSK)) is commonly used. If PDM-QPSK is used, the modulation rate is about 25 GBd (Giga Baud). On the other hand, if ultrahigh speed optical transmission as fast as 100 Gb/s is performed using the modulation method of PAM4, the modulation rate is about 50 GBd. Accordingly, if PAM4 is used, the signal spectrum occupies a frequency range that is wider than that occupied when the PDM-QPSK method is used.

A wide frequency range being occupied means that if the modulation method of PAM4 is applied to realize ultrahigh speed optical transmission as fast as 100 Gb/s, the optical transmission is largely affected by waveform deterioration due to band limitation of an electrical device, when compared to a case in which the PDM-QPSK method is used. Also, in direct wave detection methods, it is not possible to compensate for waveform deterioration due to wavelength dispersion involved in transmission fibers through digital signal processing, and therefore deterioration in signal quality due to wavelength dispersion is also a major problem when the PAM4 method is applied. Deterioration in signal quality due to wavelength dispersion is proportional to the square of the modulation rate, and accordingly, deterioration in signal quality due to wavelength dispersion is significant particularly in the case of a signal that is modulated at a high rate of 50 Gbaud or higher.

CITATION LIST

Non Patent Literature

[NPL 1] Joo Sung Park, Saul B. Gelfand and Michael P. Fitz, "A Spectral Shaping Nonlinear Binary Coded Modulation with Gray-Mapped QAM Signals", The 2010 Military Communications Conference—Unclassified Program—Waveforms and Signal Processing Track, pp. 2363-2368

SUMMARY OF THE INVENTION

Technical Problem

As described above, the problems in realization of ultrahigh speed optical transmission as fast as 100 Gb/s using the PAM4 method are deterioration in signal quality due to band limitation of an electro-optical device, and deterioration in signal quality due to wavelength dispersion involved in optical fiber transmission paths.

Conventionally, as a method in which a narrower bandwidth of a spectrum of a signal for a coherent wave detection method is realized to suppress deterioration in signal quality as described above, a method that uses nonlinear trellis coding has been proposed (see NPL 1, for example). However, the method disclosed in NPL 1 is a method that is applied to a QAM (Quadrature Amplitude Modulation) modulated signal, and thus is not applicable to a PAM4 signal, which is for a direct wave detection method. Therefore, a narrower bandwidth of a spectrum cannot be realized, and thus there is the problem that it is not possible to suppress deterioration in signal quality. Note that such a problem occurs not only in the PAM4 method but also in a method using a suitable multi-value symbol.

In view of the aforementioned circumstances, an object of the present invention is to provide a technique that can suppress deterioration in signal quality.

Means for Solving the Problem

An aspect of the present invention relates to an optical transmission system including: an optical transmitter; and an optical receiver, wherein the optical transmitter includes: a signal coding unit configured to perform nonlinear trellis coding, which corresponds to nonlinear calculation, on a symbol sequence; and a modulator configured to modulate the symbol sequence subjected to the nonlinear trellis coding by the signal coding unit, and transmit the modulated symbol sequence to the optical receiver, and the optical receiver includes: a light receiving unit configured to receive an optical signal transmitted from the optical transmitter, and convert the received optical signal into an electrical signal; and a digital signal processing unit configured to perform digital signal processing on the electrical signal to reconstruct the symbol sequence.

An aspect of the present invention relates to the above-described optical transmission system, wherein the optical receiver further includes a Viterbi decoding unit configured to perform symbol determination based on sequence estimation using Viterbi decoding when the electrical signal is demodulated.

An aspect of the present invention relates to the above-described optical transmission system, wherein the optical transmitter further includes a signal generation unit configured to generate, using input information data, a Gray-coded N (where N is an integer of 2 or greater)-value symbol, the signal coding unit performs nonlinear trellis coding processing given by Expressions 7 to 9 below to generate an N+2-value symbol, and the digital signal processing unit performs predetermined determination on the electrical signal to reconstruct the N+2-value symbol, and reconstructs the N-value symbol before the nonlinear trellis coding, based on Expressions 10 to 12 below, using the reconstructed N+2-value symbol and an already determined N+2-value symbol in a previous time slot.

An aspect of the present invention relates to the above-described optical transmission system, wherein the optical transmitter further includes a signal generation unit configured to generate, using input information data, two systems of Gray-coded N (where N is an integer of 2 or greater)-value symbols, the signal coding unit performs nonlinear trellis coding processing given by Expressions 7 to 9 below to generate two systems of N+2-value symbols, and the digital signal processing unit performs predetermined determination on the electrical signal to reconstruct the two systems of N+2-value symbols, and reconstructs the N-value symbols before the nonlinear trellis coding, based on Expressions 10 to 12 below, using the plurality of reconstructed N+2-value symbols and a plurality of already determined N+2-value symbols in a previous time slot.

Effects of the Invention

According to the present invention, it is possible to suppress deterioration in signal quality.

DESCRIPTION OF EMBODIMENTS

Hereinafter, embodiment of the present invention will be described with reference to the drawings.

Overview

First, overview of the present invention will be described based on a comparison with a conventional technology.

Figure 1:
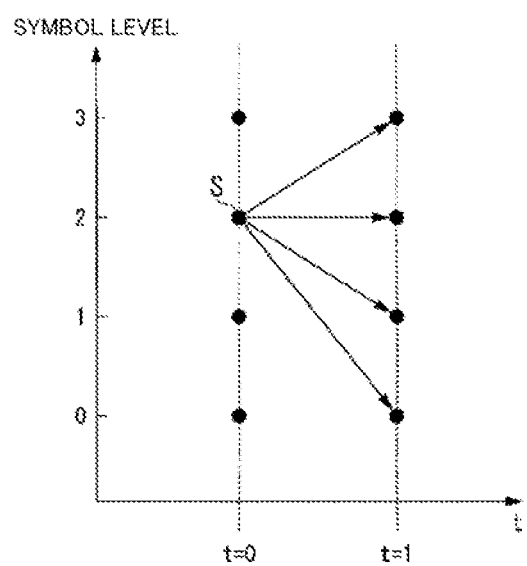
FIG. 1 is a diagram illustrating symbols in time slots, and symbol transition relationship between the successive time slots.

In a conventional PAM4 method, 2-bit data information is assigned to an optical intensity using four value (4-value) symbols 0, 1, 2, and 3, and thereby transmission of 2 bit/symbol is realized. FIG. 1 is a diagram illustrating symbols in time slots, and symbol transition relationship between the successive time slots. As shown in FIG. 1, in a case of the conventional PAM4 method, if the value (symbol level) of a symbol S is "2" at a time slot t=0 for example, the symbol S can be transitioned to a symbol S of any one of 0, 1, 2, and 3 at t=1. In other words, in the conventional PAM4 method, there is no condition set for transition of the symbol S. When a random signal sequence is to be transmitted, the transition probability from each symbol S to each symbol S is ¼ to all the events of transition. If this symbol transition is applied to a discrete Markov chain model, the transition probability matrix P will be given by Expression 1 below.

[Formula 1]

$$P = \begin{pmatrix} 1/4 & 1/4 & 1/4 & 1/4 \\ 1/4 & 1/4 & 1/4 & 1/4 \\ 1/4 & 1/4 & 1/4 & 1/4 \\ 1/4 & 1/4 & 1/4 & 1/4 \end{pmatrix} \quad \text{(Expression 1)}$$

Where the elements $p_{ij}$ (i, j=0, 1, 2, 3) of the matrix denote the probability of transition from state j to state i. An eigenvector q of this transition matrix with respect to an eigenvalue of 1 is given by Expression 2 below.

[Formula 2]

$$q = \begin{pmatrix} 1/4 \\ 1/4 \\ 1/4 \\ 1/4 \end{pmatrix} \quad \text{(Expression 2)}$$

The probability of occurrence of each state (symbol) is ¼, and the symbols occur at the same probability. In contrast, according to the present invention, nonlinear trellis coding is used to control the state transition probability, so that the bandwidth of a spectrum of a PAM4 signal is made narrower, and improvements in resistance to band limitation and resistance to wavelength dispersion are realized.

The following describes a procedure of the nonlinear trellis coding according to the present invention.

Assume that an original 4-value signal before coding in a time slot n (n is an integer of 1 or greater) is denoted by $u_n$, $u_n$ is a 4-value symbol with 0, 1, 2, and 3. Here, it is assumed that 2 bits that are Gray-coded are assigned to each of the symbols. That is to say, it is assumed that coding is applied such that the Hamming distance between adjacent symbols is 1. For example, Gray code is such that bit 01 is assigned to symbol 0, bit 00 is assigned to symbol 1, bit 10 is assigned to symbol 2, and bit 11 is assigned to symbol 3. Assumed that a symbol after coding (coded symbol) is denoted by $v_n$, a coded symbol that is obtained through the nonlinear trellis coding of the present invention is generated based on Expression 3 below.

[Formula 3]

$$v_n = u_n - \left[\frac{v_{n-1}}{2}\right] \quad \text{(Expression 3)}$$

Here, [.] is a Gauss symbol, and indicates processing that corresponds to nonlinear calculation. By performing such coding, a 6-value symbol with 0, 1, 2, 3, 4, and 5 is obtained as the coded symbol $v_n$. The transition probability matrix P of the coded symbol $v_n$ is given by Expression 4 below.

[Formula 4]

$$P = \begin{pmatrix} 1/4 & 1/4 & 0 & 0 & 0 & 0 \\ 1/4 & 1/4 & 1/4 & 1/4 & 0 & 0 \\ 1/4 & 1/4 & 1/4 & 1/4 & 1/4 & 1/4 \\ 1/4 & 1/4 & 1/4 & 1/4 & 1/4 & 1/4 \\ 0 & 0 & 1/4 & 1/4 & 1/4 & 1/4 \\ 0 & 0 & 0 & 0 & 1/4 & 1/4 \end{pmatrix} \quad \text{(Expression 4)}$$

As is clear from Expression 4, as a result of applying the nonlinear trellis coding of the present invention, transition of the coded symbol $v_n$ is partially restricted. For example, the symbol 0 can be transitioned to four symbols of 0, 1, 2, and 3, but is not allowed to be transitioned to the symbols 4 and 5. Accordingly, in the present invention, such a restriction added to symbol transition suppresses occurrence of symbol transition at a high frequency, thereby realizing a narrower bandwidth of a signal spectrum. The eigenvector q of this transition matrix with respect to an eigenvalue of 1 is given by Expression 5 below.

[Formula 5]

$$q = \begin{pmatrix} 1/16 \\ 3/16 \\ 4/16 \\ 4/16 \\ 3/16 \\ 1/16 \end{pmatrix} \quad \text{(Expression 5)}$$

The probabilities of occurrence of the states (symbols) are not equal to each other, and the symbols in the central portion occur at a higher probability. This means that the nonlinear trellis coding of the present invention is processing that corresponds to probability shaping.

Figure 2:
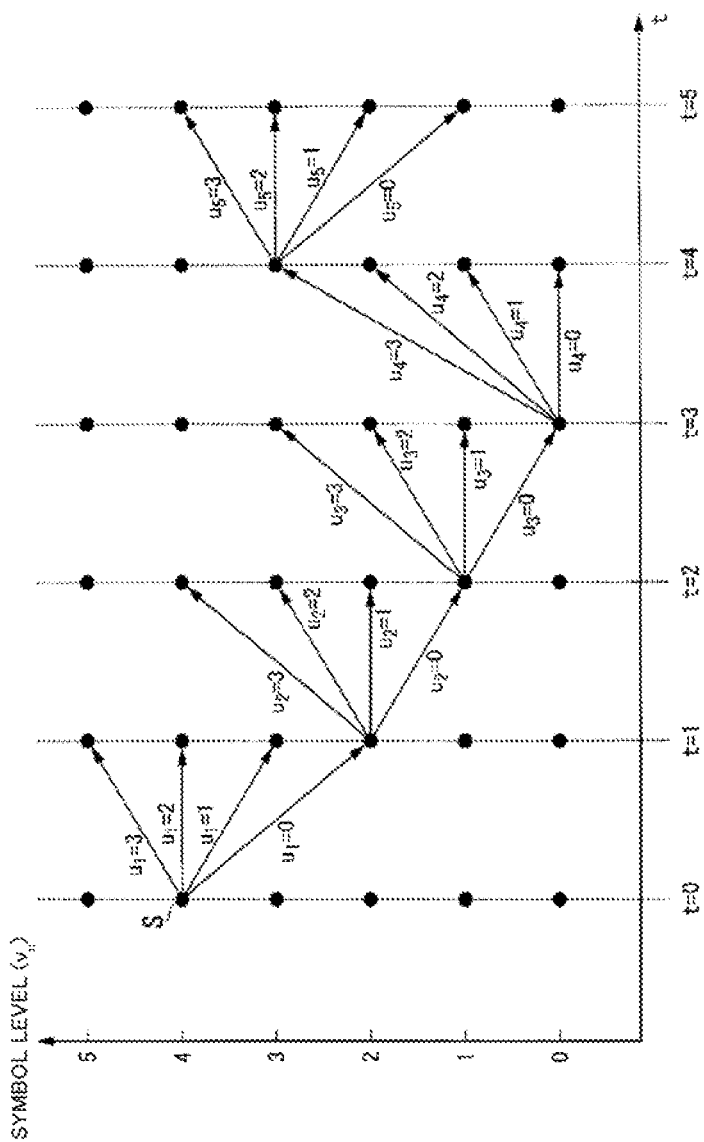
FIG. 2 is a diagram schematically illustrating symbol transition of symbols that were encoded by nonlinear trellis coding according to the present invention.

FIG. 2 is a diagram schematically illustrating symbol transition of the symbols $v_n$ coded through the nonlinear trellis coding of the present invention. As is clear from FIG. 2, $u_n$, which is information before coding, corresponds to state transition of $v_n$, which is a symbol after coding. In other words, the nonlinear trellis coding of the present invention is a method in which information is assigned to state transition, and a restriction is added to the state transition to suppress occurrence of a high-frequency component.

Figure 3:
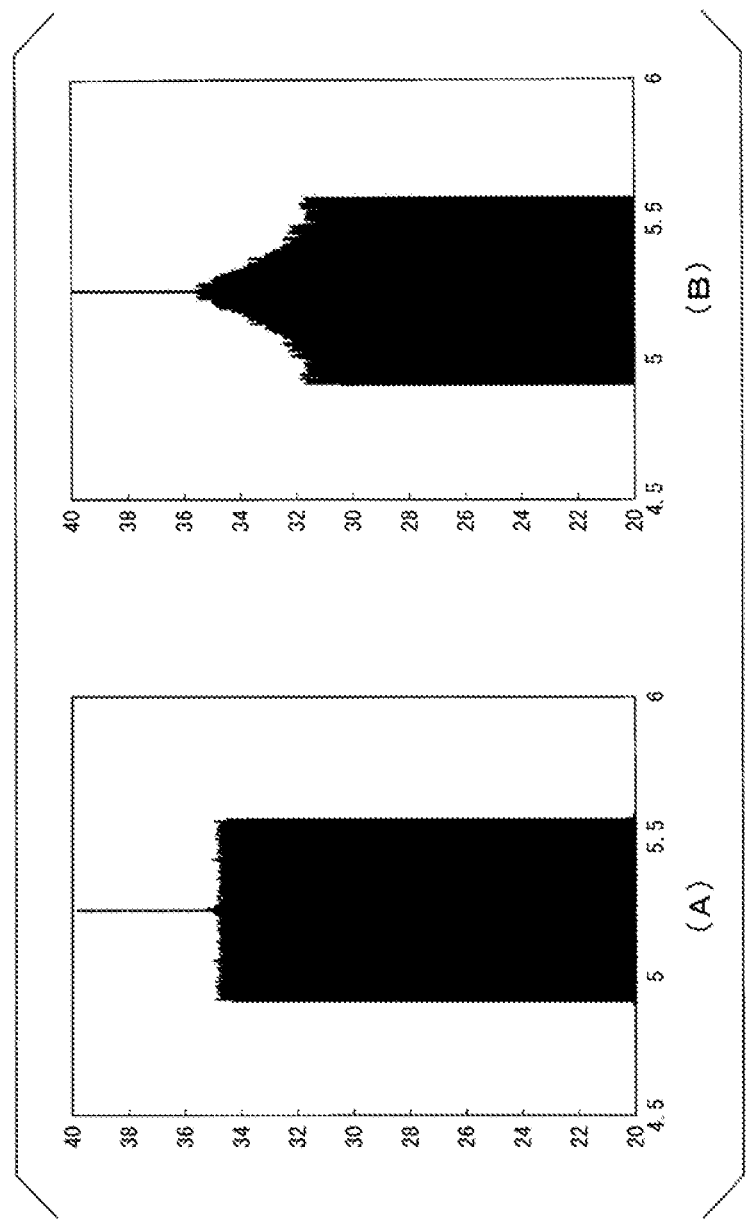
FIG. 3 illustrate a signal spectrum of a conventional PAM4 signal, and a signal spectrum of a PAM4 signal to which the nonlinear trellis coding of the present invention is applied.

FIG. 3 show a signal spectrum of a conventional PAM4 signal, and a signal spectrum of a PAM4 signal (NLTCP signal) to which the nonlinear trellis coding of the present invention has been applied. FIG. 3(A) is a diagram showing the signal spectrum of the conventional PAM4 signal, and FIG. 3(B) is a diagram showing the signal spectrum of the PAM4 signal (NLTCP signal) to which the nonlinear trellis coding of the present invention has been applied. In FIG. 3, the horizontal axes indicate the frequency, and the longitudinal axes indicate the signal power. Note that a raised-cosine filter having the roll-off factor of 0.01 is applied to both of the signals.

As is clear from FIGS. 3(A) and 3(B), applying the nonlinear trellis coding suppresses high-frequency components of the signal spectra, and the signal power is concentrated in low-frequency regions.

The following will describe specific processing with reference to embodiments.

First Embodiment

Figure 4:
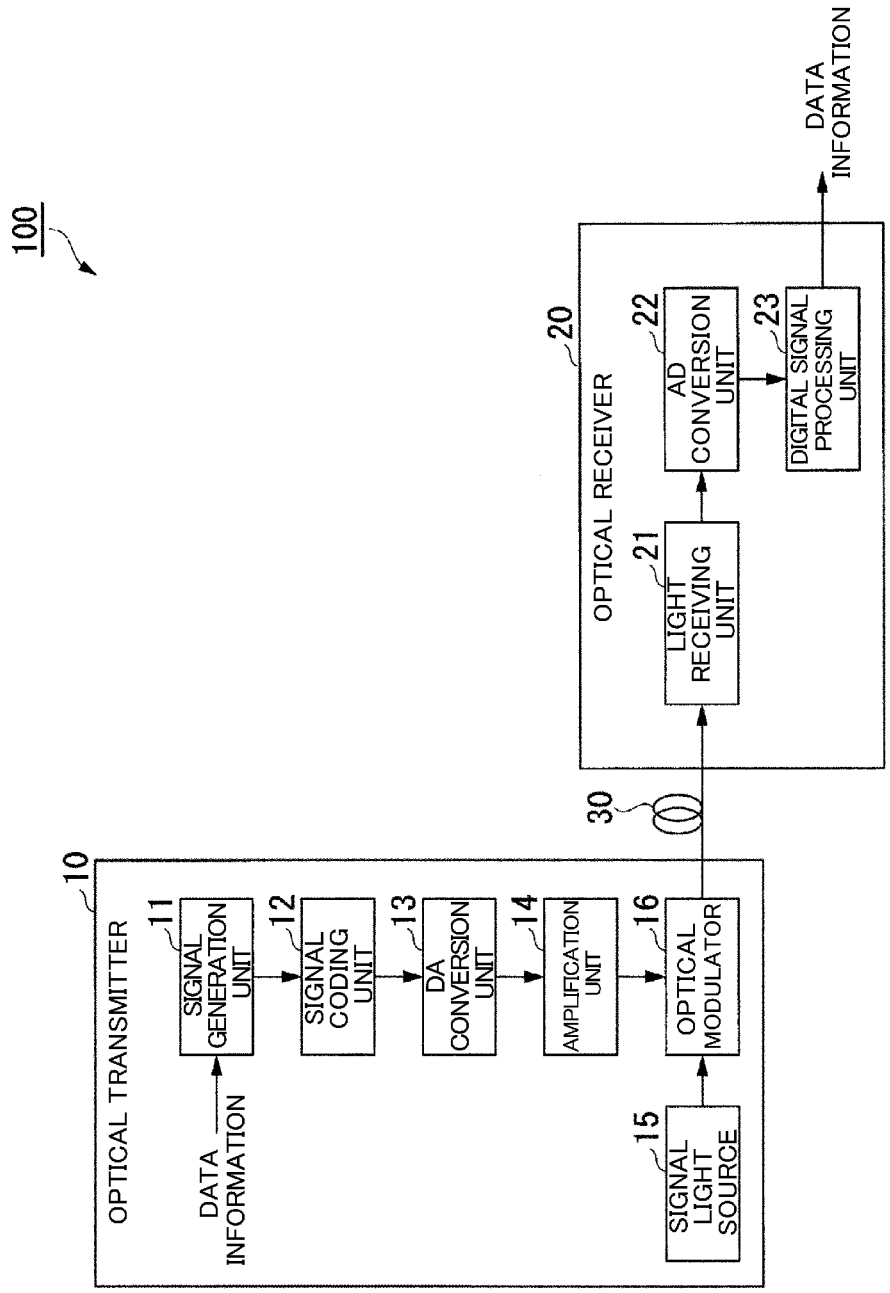
FIG. 4 is a diagram illustrating a system configuration of an optical transmission system according to a first embodiment.

FIG. 4 is a diagram showing a system configuration of an optical transmission system 100 according to a first embodiment. The optical transmission system 100 includes an optical transmitter 10 and an optical receiver 20. The optical transmitter 10 and the optical receiver 20 are connected to each other via an optical fiber 30. The optical fiber 30 is a transmission path that connects the optical transmitter 10 and the optical receiver 20.

The optical transmitter 10 includes a signal generation unit 11, a signal coding unit 12, a DA conversion unit 13, an amplification unit 14, a signal light source 15, and an optical modulator 16.

The signal generation unit 11 inputs, from the outside, data information that is to be transmitted, and generates a Gray-coded 4-value symbol $u_n$ (0, 1, 2, 3) based on the input data information.

The signal coding unit 12 performs nonlinear trellis coding processing on the 4-value symbol $u_n$ (0, 1, 2, 3) generated by the signal generation unit 11 to generate a 6-value symbol $v_n$ (0, 1, 2, 3, 4, 5). Specifically, the signal coding unit 12 performs the nonlinear trellis coding processing given by Expression 3 above on the 4-value symbol $u_n$ (0, 1, 2, 3) to generate a 6-value symbol $v_n$ (0, 1, 2, 3, 4, 5).

The DA conversion unit 13 converts a digital signal of the 6-value symbol $v_n$ (0, 1, 2, 3, 4, 5) generated by the signal coding unit 12 into an analog signal. The DA conversion unit 13 outputs the analog signal to the amplification unit 14.

The amplification unit 14 amplifies the signal power of the analog signal output from the DA conversion unit 13, and applies the amplified signal power to the optical modulator 16.

The signal light source 15 emits continuous light to the optical modulator 16.

The optical modulator 16 modulates the continuous light emitted from the signal light source 15 with the analog signal amplified by the amplification unit 14, and thereby generates an NLTCP signal that is a 6-value optical intensity modulated signal. The optical modulator 16 transmits the generated NLTCP signal to the optical receiver 20 via the optical fiber 30. Note that the signal light source 15 and the optical modulator 16 are not necessarily separate from each other. The optical modulator 16 may directly modulate the continuous light emitted from the signal light source 15, and thereby generate an NLTCP signal that is a 6-value optical intensity modulated signal.

The optical receiver 20 includes a light receiving unit 21, an AD conversion unit 22, and a digital signal processing unit 23.

The light receiving unit 21 performs direct wave detection on the NLTCP signal transmitted from the optical transmitter 10, and acquires optical intensity information of the NLTCP signal. The light receiving unit 21 converts the acquired optical intensity information into an analog electrical signal, and outputs the analog electrical signal to the AD conversion unit 22.

The AD conversion unit 22 converts the analog electrical signal output from the light receiving unit 21 into a digital signal.

The digital signal processing unit 23 processes the digital signal, and thereby acquires $u_n$ that is the 4-value symbol before the nonlinear trellis coding.

Figure 5:
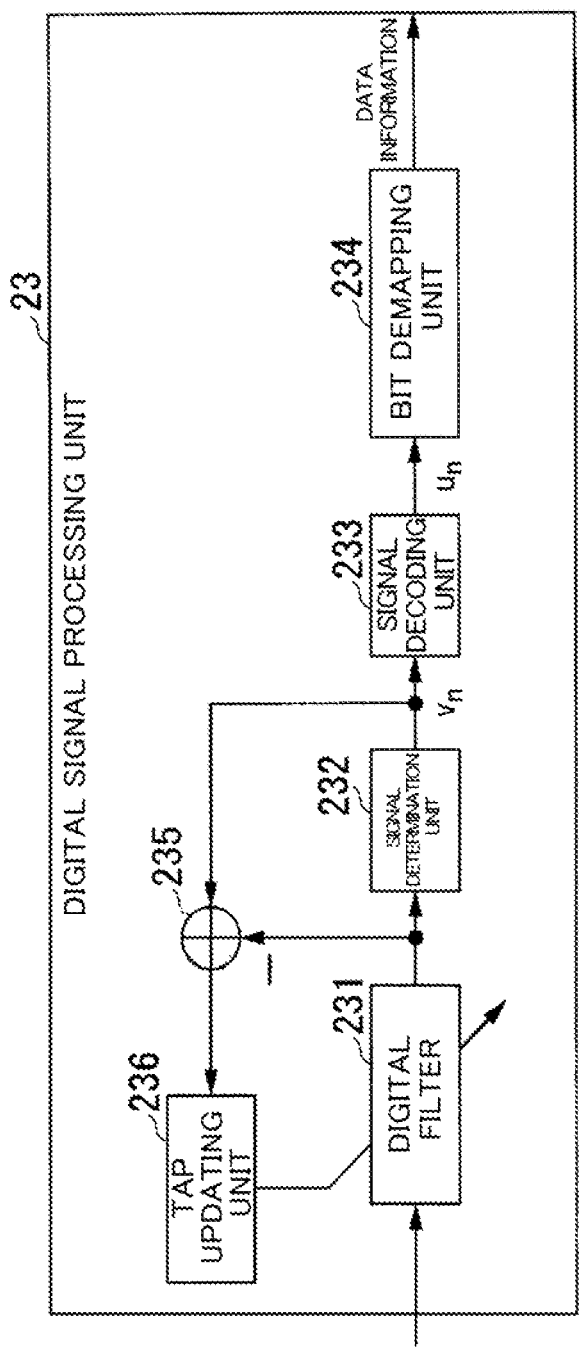
FIG. 5 is a diagram illustrating an internal configuration of a digital signal processing unit according to the first embodiment.

FIG. 5 is a diagram showing an internal configuration of the digital signal processing unit 23 of the first embodiment.

The digital signal processing unit 23 includes a digital filter 231, a signal determination unit 232, a signal decoding unit 233, a bit demapping unit 234, an adder 235 and a tap updating unit 236.

The digital filter 231 is constituted by a complex tap, and performs waveform shaping on the NLTCP signal. The digital filter 231 outputs the waveform-shaped NLTCP signal to the signal determination unit 232 and the adder 235. As the digital filter 231, a typical linear filter such as a FIR (Finite Impulse Response) filter, or a Volterra filter that can describe a high-order transfer function is used.

The signal determination unit 232 subjects the waveform-shaped NLTCP signal to threshold determination so as to acquire the 6-value symbol $v_n$. The signal determination unit 232 outputs the acquired 6-value symbol $v_n$ to the signal decoding unit 233 and the adder 235.

The signal decoding unit 233 executes processing based on Expression 6 below, using the 6-value symbol $v_n$ output from the signal determination unit 232 and an already determined 6-value symbol $v_{n-1}$ in the previous time slot, and thereby reconstructs $u_n$ that is the 4-value symbol before the coding.

[Formula 6]

$$u_n = v_n - \left[\frac{v_{n-1}}{2}\right]$$ (Expression 6)

Note however that the signal decoding unit 233 sets $u_n$ obtained by Expression 6 to 0 if $u_n<0$ is satisfied, and sets $u_n$ to 3 if $u_n>3$ is satisfied.

The bit demapping unit 234 performs gray decoding on $u_n$ that is the 4-value symbol reconstructed by the signal decoding unit 233, and thereby reconstructs the data information, which is bit information, from $u_n$.

The adder 235 incorporates the value output from the digital filter 231 and the value output from the signal determination unit 232. Note that the adder 235 gives the minus sign to the value output from the digital filter 231, and incorporates the value. The adder 235 adds up the two incorporated values, that is, subtracts the value output from the digital filter 231 from the value output from the signal determination unit 232. The adder 235 outputs the subtraction result obtained by the subtraction to the tap updating unit 236.

The tap updating unit 236 updates the tap coefficient of the digital filter 231 based on the difference between the value after the determination of the signal determination unit 232 and the value before the determination of the signal determination unit 232. Specifically, the tap updating unit 236 updates the tap coefficient of the digital filter 231 so that the difference between the value output from the digital filter 231 and the value output from the signal determination unit 232 is minimum, that is, the subtraction result is 0. Accordingly, the accuracy of the demodulation is improved.

Figure 6:
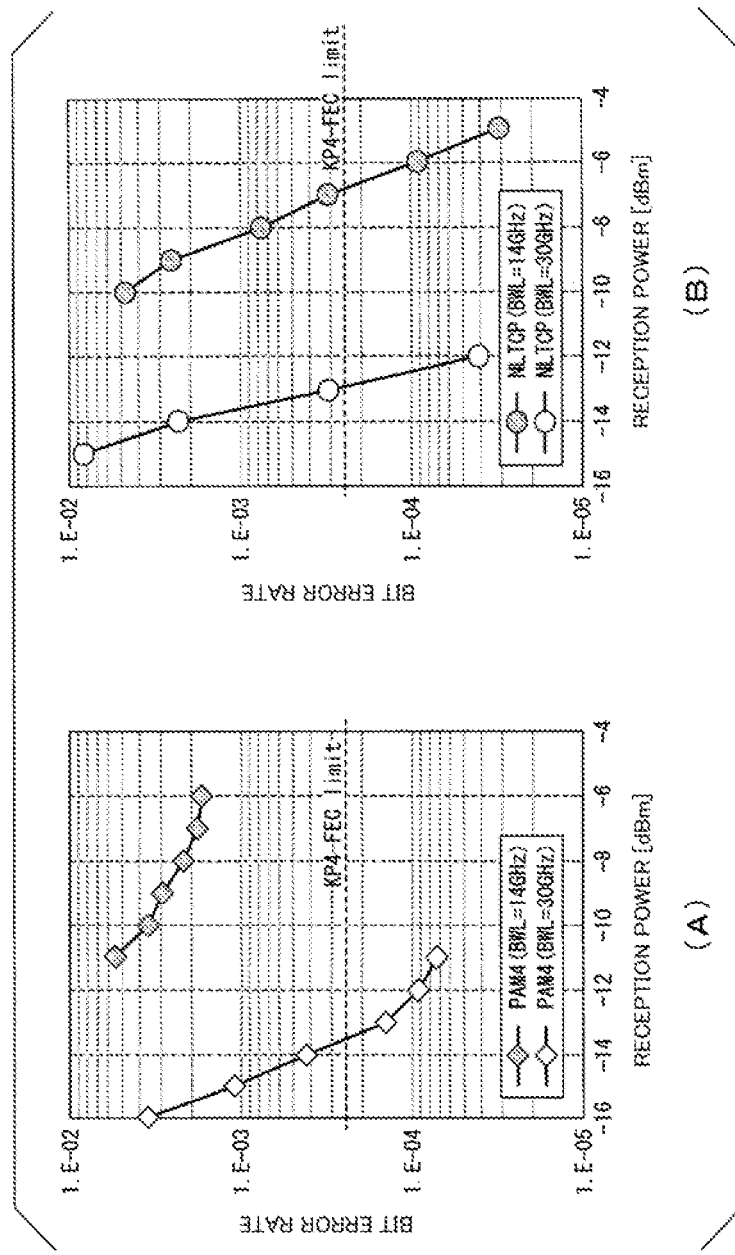
FIG. 6 illustrate transmission characteristics, evaluated by numerical simulation, of conventional PAM4 signals and NLTCP signals of the present invention that are under band-limited circumstances.

FIG. 6 illustrate transmission characteristics, evaluated by numerical simulation, of conventional PAM4 signals and NLTCP signals of the present invention under band-limited circumstances. FIG. 6(A) is a diagram showing the transmission characteristics of the PAM4 signals under band-limited circumstances, and FIG. 6(B) is a diagram showing the transmission characteristics of the NLTCP signals of the present invention under band-limited circumstances. In FIG. 6, the horizontal axes indicate the reception power, and the longitudinal axes indicate the bit error rate. Also, in both of FIGS. 6(A) and 6(B), the modulation rate of the signals is 56 Gbaud, and the transmission capacity is 112 Gb/s.

As shown in FIG. 6(A), the conventional PAM4 signal under band-limited circumstances of 14 GHz, which corresponds to 25% of the modulation rate, has limited transmission characteristics due to waveform deterioration resulting from the band limitation, even if the reception power is sufficiently large. Therefore, it is not possible to achieve the bit error rate (BER) that is lower than $2.5 \times 10^{-4}$, which is the error correction limit of KP4-FEC widely used in the short range optical transmission system.

In contrast, as shown in FIG. 6(B), the NLTCP signal of the present invention can achieve the error correction limit of the KP4-FEC even under band-limited circumstances of 14 GHz.

Figure 7:
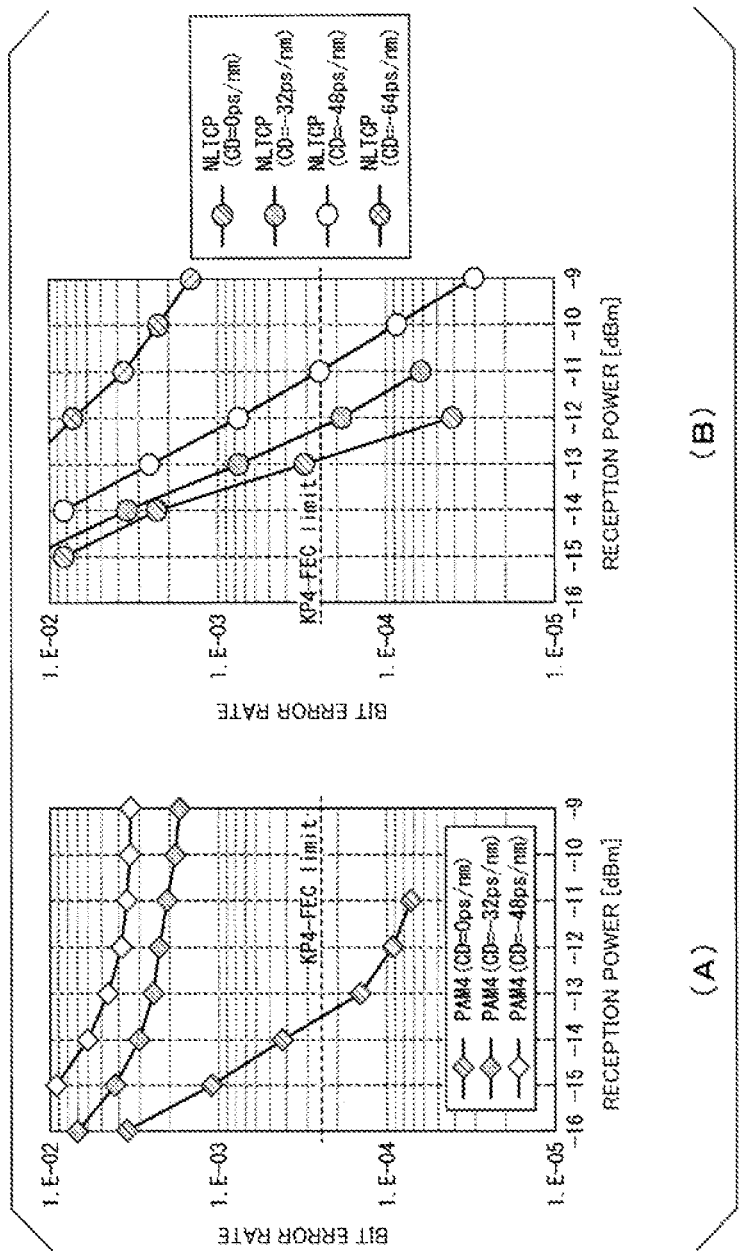
FIG. 7 illustrate transmission characteristics, evaluated by numerical simulation, of conventional PAM4 signals and NLTCP signals of the present invention under the circumstances of being transmitted through an optical fiber.

FIG. 7 illustrate transmission characteristics, evaluated by numerical simulation, of conventional PAM4 signals and NLTCP signals under the circumstances of being transmitted through an optical fiber, that is, under the circumstances of wavelength dispersion.

FIG. 7(A) is a diagram showing the transmission characteristics of the PAM4 signals under the circumstances of being transmitted through an optical fiber, and FIG. 7(B) is a diagram showing the transmission characteristics of the NLTCP signals of the present invention under the circumstances of being transmitted through an optical fiber. In FIG. 7, the horizontal axes indicate the reception power, and the longitudinal axes indicate the bit error rate. Also, in both of FIGS. 7(A) and 7(B), the modulation rate of the signals is 56 Gbaud, and the transmission capacity is 112 Gb/s. Also, the band limitation for the signals is set at 30 GHz.

As shown in FIG. 7(A), the conventional PAM4 signal under the circumstances of wavelength dispersion of −32 ps/nm has limited transmission characteristics due to waveform deterioration resulting from the wavelength dispersion, even if the reception power is sufficiently large. Therefore, it is not possible to achieve the error correction limit of the KP4-FEC. In contrast, as shown in FIG. 7(B), the NLTCP signal of the present invention can achieve the error correction limit of the KP4-FEC even under the circumstances of wavelength dispersion of −48 ps/nm.

As described above, by applying the nonlinear trellis coding according to the present invention, it is possible to realize drastic improvements in resistance to band limitation and resistance to wavelength dispersion with respect to a PAM4 signal.

With the optical transmission system 100 having the above-described configuration, it is possible to suppress deterioration in signal quality. Specifically, the optical transmitter 10 performs nonlinear trellis coding processing on a 4-value symbol to generate a 6-value symbol, and transmits an optical signal (NLTCP signal) obtained based on the generated 6-value symbol to the optical receiver 20. As a result of the optical transmitter 10 performing nonlinear trellis coding processing, a restriction is added to transition of the coded symbol. Therefore, the probabilities of occurrence of the states (symbols) are not equal to each other, and the symbols in the central portion occur at a higher probability. With this configuration, the number of drastic changes in the intensity is reduced in a temporal view, and thus it is possible to suppress occurrence of symbol transition at a high frequency, and realize a narrower bandwidth of a signal spectrum. Accordingly, deterioration in signal quality due to band limitation of an electro-optical device, and deterioration in signal quality due to wavelength dispersion of an optical fiber transmission path are suppressed.

Second Embodiment

In a second embodiment, an optical receiver performs demodulation based on MLSE (Maximum Likelihood Sequence Estimation).

In the second embodiment, the configuration of the optical transmitter 10 is the same as that in the first embodiment, and thus a description thereof is omitted. The configuration of the optical receiver 20 differs from the optical receiver 20 of the first embodiment in that a digital signal processing unit 23a is provided instead of the digital signal processing unit 23. The following describes the difference.

Figure 8:
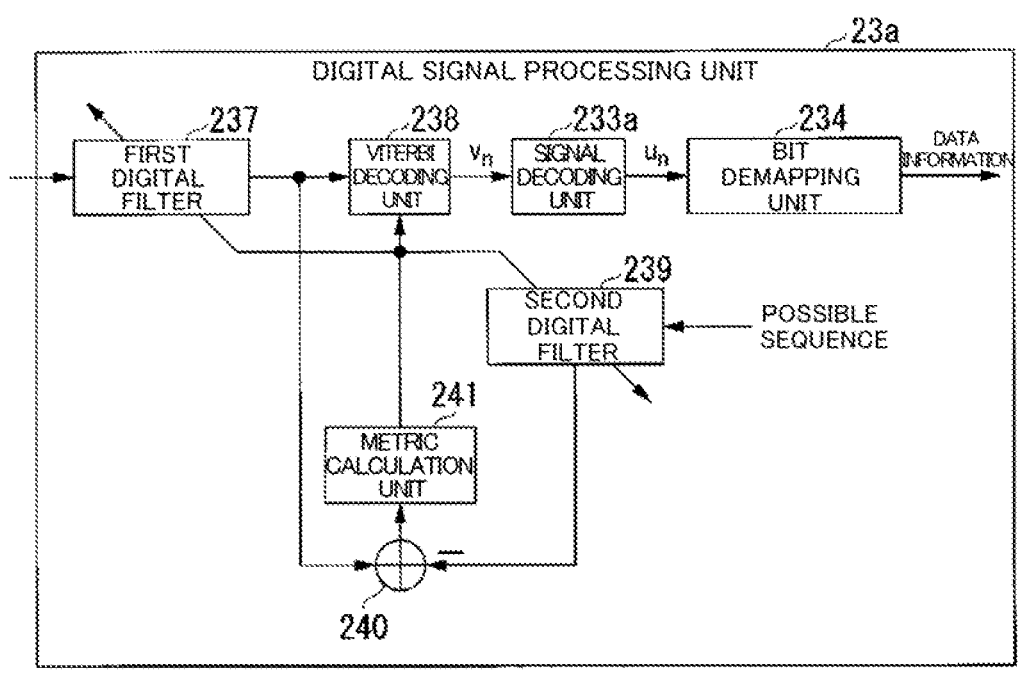
FIG. 8 is a diagram illustrating an internal configuration of a digital signal processing unit according to a second embodiment.

FIG. 8 is a diagram showing an internal configuration of the digital signal processing unit 23a of the second embodiment.

The digital signal processing unit 23a includes a signal decoding unit 233a, the bit demapping unit 234, a first digital filter 237, a Viterbi decoding unit 238, a second digital filter 239, an adder 240, and a metric calculation unit 241.

The first digital filter 237 is constituted by a complex tap, and performs waveform shaping on an NLTCP signal. The first digital filter 237 outputs the waveform-shaped NLTCP signal to the Viterbi decoding unit 238 and the adder 240. As the first digital filter 237, a typical linear filter such as a FIR filter or a Volterra filter is used.

The Viterbi decoding unit 238 performs sequence estimation on a 6-value symbol $v_n$, based on the waveform-shaped NLTCP signal output from the first digital filter 237 and a metric output from the metric calculation unit 241. Specifically, the Viterbi decoding unit 238 performs sequence estimation on a 6-value symbol $v_n$ based on a Viterbi algorithm. The Viterbi decoding unit 238 employs the symbol sequence having the smallest metric, out of metrics obtained as a result of the sequence estimation, as a transmission sequence $v_n$. One example of the metric output from the metric calculation unit 241 is a Euclidean distance between time-series data obtained by the second digital filter 239 performing digital filtering processing on a conceivable possible sequence (possible sequence), and time-series data output from the first digital filter 237.

The second digital filter 239 is constituted by a complex tap, and acquires time-series data by performing digital filtering processing on an input possible sequence. The second digital filter 239 outputs the acquired time-series data to the adder 240. As the second digital filter 239, a typical linear filter such as a FIR filter or a Volterra filter is used. In particular, a Volterra filter is preferably used as the second digital filter 239 when the system has a large nonlinear response.

Note that in the nonlinear trellis coding of the present invention, the following twenty-four types of possible sequences are conceivable since a restriction is added to symbol transition.

00
01
02
03
10
11
12
13
21
22
23
24
31
32
33
34
42
43
44
45
52
53
54
55

In other words, determination of the symbol sequence $v_n$ in the present embodiment is maximum likelihood sequence estimation (MLSE) itself that has a memory length of 2.

The adder 240 incorporates the value output from the first digital filter 237, and the value output from the second digital filter 239. Note that the adder 240 gives the minus sign to the value output from the second digital filter 239, and incorporates the value. The adder 240 adds up the two incorporated values, that is, subtracts the value (time-series data) output from the second digital filter 239 from the value (time-series data) output from the first digital filter 237. The adder 240 outputs the subtraction result obtained by the subtraction to the metric calculation unit 241.

The metric calculation unit 241 calculates, as a metric, the subtraction result output from the adder 240, that is, a Euclidean distance between the time-series data obtained by the second digital filter 239 performing digital filtering processing on a conceivable possible sequence (possible sequence), and the time-series data output from the first digital filter.

The signal decoding unit 233a uses Expression 6 to reconstructs $u_n$ that is the 4-value symbol before the coding, based on the transmission sequence $v_n$ employed by the Viterbi decoding unit 238.

The bit demapping unit 234 performs gray decoding on $u_n$ that is the 4-value symbol reconstructed by the signal decoding unit 233a, and thereby reconstructs the data information, which is bit information, from $u_n$.

According to the optical transmission system 100 of the second embodiment that has the above-described configurations, it is possible to achieve the same effects as those of the first embodiment.

Third Embodiment

In the first and second embodiments, a PAM4 signal is used as a symbol before coding, but the present invention is also applicable to a suitable multi-value symbol. Accordingly, a third embodiment describes a configuration in which the nonlinear trellis coding of the present invention is applied to an N-value PAM signal (PAM-N signal).

The configurations of an optical transmitter and an optical receiver according to the third embodiment are the same as those of the first embodiment.

First, the configuration of the optical transmitter 10 according to the third embodiment is described.

The signal generation unit 11 inputs, from the outside, data information that is to be transmitted, and generates a Gray-coded N-value symbol $u_n$ (0, 1, ..., N−1) based on the input data information.

The signal coding unit 12 performs nonlinear trellis coding processing on the N-value symbol $u_n$ (0, 1, ..., N−1) generated by the signal generation unit 11 to generate an N+2-value symbol $v_n$ (0, 1, ..., N+1). Specifically, the signal coding unit 12 performs nonlinear trellis coding processing given by Expressions 7 to 9 below on the N+2-value symbol $v_n$ (0, 1, ..., N+1) to generate an N+2-value symbol $v_n$ (0, 1, ..., N+1).

[Formula 7]

$$v_n = u_n (v_{n-1} < N/2) \quad \text{(Expression 7)}$$

[Formula 8]

$$v_n = u_n + 1 (N/2 \le v_{n-1} < (N/2)+2) \quad \text{(Expression 8)}$$

[Formula 9]

$$v_n = u_n + 2 ((N/2)+2 \le v_{n-1}) \quad \text{(Expression 9)}$$

The DA conversion unit 13 converts the digital signal of the N+2-value symbol $v_n$ (0, 1, ..., N+1) generated by the signal coding unit 12 into an analog signal. The DA conversion unit 13 outputs the analog signal to the amplification unit 14.

The amplification unit 14 amplifies the signal power of the analog signal output from the DA conversion unit 13, and applies the amplified signal power to the optical modulator 16.

The signal light source 15 emits continuous light to the optical modulator 16.

The optical modulator 16 modulates the continuous light emitted from the signal light source 15 with the analog signal amplified by the amplification unit 14, and thereby generates an NLTCP signal that is a N+2-value optical intensity modulated signal. The optical modulator 16 transmits the generated NLTCP signal to the optical receiver 20 via the optical fiber 30. Note that the signal light source 15 and the optical modulator 16 are not necessarily separate from each other. The optical modulator 16 may directly modulate the continuous light emitted from the signal light source 15, and thereby generate an NLTCP signal that is a N+2-value optical intensity modulated signal.

Next, the configuration of the optical receiver 20 of the third embodiment is described.

The light receiving unit 21 performs direct wave detection on the NLTCP signal transmitted from the optical transmitter 10, and acquires optical intensity information of the NLTCP signal. The light receiving unit 21 converts the acquired optical intensity information into an analog electrical signal, and outputs the analog electrical signal to the AD conversion unit 22.

The AD conversion unit 22 converts the analog electrical signal output from the light receiving unit 21 into a digital signal.

The digital signal processing unit 23 processes the digital signal, and thereby acquires $u_n$ that is the N-value symbol before the nonlinear trellis coding.

The configuration of the digital signal processing unit 23 is the same as that of the first embodiment. That is to say, the digital signal processing unit 23 includes the digital filter 231, the signal determination unit 232, the signal decoding unit 233, the bit demapping unit 234, the adder 235, and the tap updating unit 236.

The digital filter 231 is constituted by a complex tap, and performs waveform shaping on the NLTCP signal. The digital filter 231 outputs the waveform-shaped NLTCP signal to the signal determination unit 232 and the adder 235. As the digital filter 231, a typical linear filter such as a FIR filter, or a Volterra filter that can describe a high-order transfer function is used.

The signal determination unit 232 subjects the NLTCP signal to threshold determination so as to acquire the N+2-value symbol $v_n$. The signal determination unit 232 outputs the acquired N+2-value symbol $v_n$ to the signal decoding unit 233 and the adder 235.

The signal decoding unit 233 executes processing based on Expressions 10 to 12 below, using the N+2-value symbol $v_n$ output from the signal determination unit 232 and an already determined N+2-value symbol $v_{n-1}$ in the previous time slot, and thereby reconstructs $u_n$ that is the N-value symbol before the coding.

[Formula 10]

$$u_n = v_n (v_{n-1} < N/2) \quad \text{(Expression 10)}$$

[Formula 11]

$$u_n = v_n - 1 (N/2 \le v_{n-1} < (N/2)+2) \quad \text{(Expression 11)}$$

[Formula 12]

$$u_n = v_n - 2 ((N/2)+2 \le v_{n-1}) \quad \text{(Expression 12)}$$

Note however that the signal decoding unit 233 sets $u_n$ obtained by Expressions 10 to 12 to 0 if $u_n < 0$ is satisfied, and sets $u_n$ to N−1 if $u_n > N-1$ is satisfied.

The bit demapping unit 234 performs gray decoding on $u_n$ that is the N-value symbol reconstructed by the signal decoding unit 233, and thereby reconstructs the data information, which is bit information, from $u_n$.

The adder 235 incorporates the value output from the digital filter 231 and the value output from the signal determination unit 232. Note that the adder 235 gives the minus sign to the value output from the digital filter 231, and incorporates the value. The adder 235 adds up the two incorporated values, that is, subtracts the value output from the digital filter 231 from the value output from the signal determination unit 232. The adder 235 outputs the subtraction result obtained by the subtraction to the tap updating unit 236.

The tap updating unit 236 updates the tap coefficient of the digital filter 231 based on the difference between the value after the determination of the signal determination unit 232 and the value before the determination of the signal determination unit 232. Specifically, the tap updating unit 236 updates the tap coefficient of the digital filter 231 so that the difference between the value output from the digital filter 231 and the value output from the signal determination unit 232 is minimum, that is, the subtraction result is 0. Accordingly, the accuracy of the demodulation is improved.

Note that the configuration of the digital signal processing unit when symbol determination is performed using Viterbi decoding is the same as that of the second embodiment. Specifically, the signal decoding unit 233 uses Expressions 10 to 12 to obtains $u_n$ that is the symbol before the nonlinear trellis coding, based on the employed transmission sequence $v_n$. The processing thereafter is the same as that of the second embodiment, and descriptions thereof are omitted.

According to the optical transmission system 100 of the third embodiment that has the above-described configurations, the present invention is also applicable to a suitable multi-value symbol.

Fourth Embodiment

The first to third embodiments have described configurations in which the technique of the present invention is applied to a PAM signal on the premise of a direct wave detection method. The technique of the present invention is also applicable to a QAM signal on the premise of a coherent detection method. A fourth embodiment describes a configuration in which the nonlinear trellis coding of the present invention is applied to 16 QAM.

Figure 9:
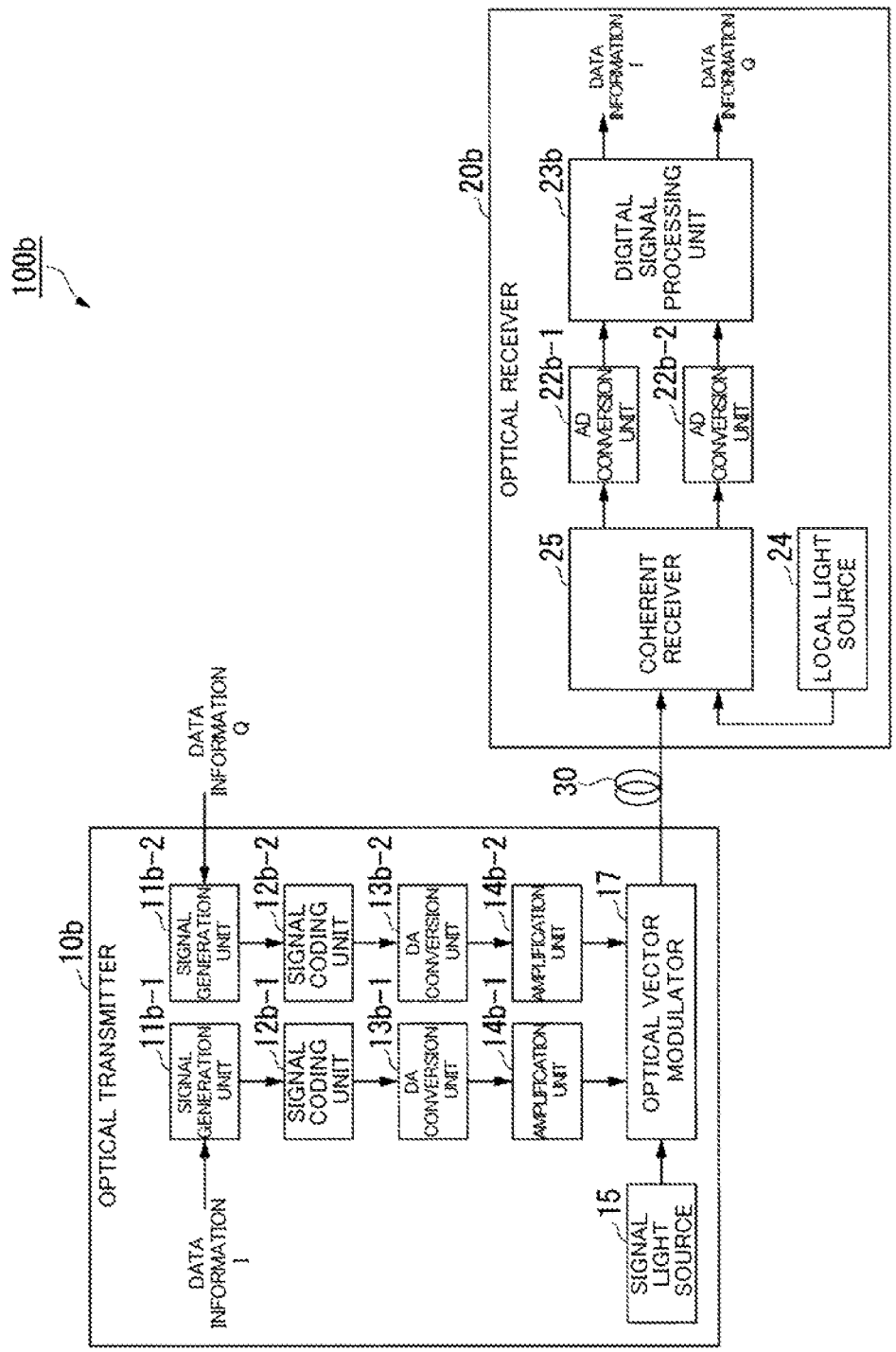
FIG. 9 is a diagram illustrating a system configuration of an optical transmission system according to a fourth embodiment.

FIG. 9 is a diagram showing a system configuration of an optical transmission system 100b according to the fourth embodiment. The optical transmission system 100b includes an optical transmitter 10b and an optical receiver 20b. The optical transmitter 10b and the optical receiver 20b are connected to each other via the optical fiber 30.

The optical transmitter 10b includes signal generation units 11b-1 and 11b-2, signal coding units 12b-1 and 12b-2, DA conversion units 13b-1 and 13b-2, amplification units 14b-1 and 14b-2, the signal light source 15, and an optical vector modulator 17. In FIG. 9, the signal generation unit 11b-1, the signal coding unit 12b-1, the DA conversion unit 13b-1, and the amplification unit 14b-1 are functional units that process data information I. Also, the signal generation unit 11b-2, the signal coding unit 12b-2, the DA conversion unit 13b-1, and the amplification unit 14b-1 are functional unit that process data information Q.

Note that in the following description, the signal generation units 11b-1 and 11b-2 are denoted as "signal generation units 11b" when they are not to be distinguished from each other. Also, in the following description, the signal coding units 12b-1 and 12b-2 are denoted as "signal coding units 12b" when they are not to be distinguished from each other. Also, in the following description, the DA conversion units 13b-1 and 13b-2 are denoted as "DA conversion units 13b" when they are not to be distinguished from each other. Also, in the following description, the amplification units 14b-1 and 14b-2 are denoted as "amplification units 14" when they are not to be distinguished from each other.

The signal generation units 11b input, from the outside, data information that is to be transmitted, and generate two systems of Gray-coded 4-value symbols based on the input data information. Specifically, the signal generation unit 11b-1 inputs, from the outside, the data information I that is to be transmitted, and generates a Gray-coded 4-value symbol $ui_n$ (0, 1, 2, 3) based on the input data information I. The signal generation unit 11b-2 inputs, from the outside, the data information Q that is to be transmitted, and generates a Gray-coded 4-value symbol $uq_n$ (0, 1, 2, 3) based on the input data information Q.

The signal coding units 12b perform nonlinear trellis coding processing on the 4-value symbols $ui_n$ (0, 1, 2, 3) and $uq_n$ (0, 1, 2, 3) generated by the signal generation units 11b, and thereby generate two systems of 6-value symbols. Specifically, the signal coding unit 12b-1 performs the nonlinear trellis coding processing given by Expression 3 above on the 4-value symbol $ui_n$ (0, 1, 2, 3) to generate a 6-value symbol $vi_n$ (0, 1, 2, 3, 4, 5). The signal coding unit 12b-2 performs the nonlinear trellis coding processing given by Expression 3 above on the 4-value symbol $uq_n$ (0, 1, 2, 3) to generate a 6-value symbol $vq_n$ (0, 1, 2, 3, 4, 5).

The DA conversion units 13b convert the digital signals of the 6-value symbols $vi_n$ (0, 1, 2, 3, 4, 5) and $vq_n$ (0, 1, 2, 3, 4, 5) generated by the signal coding units 12b into analog signals. Specifically, the DA conversion unit 13b-1 converts the digital signal of the 6-value symbol $vi_n$ (0, 1, 2, 3, 4, 5) generated by the signal coding unit 12b-1 into an analog signal. The DA conversion unit 13b-1 outputs the analog signal to the amplification unit 14b-1. The DA conversion unit 13b-2 converts the digital signal of the 6-value symbol $vq_n$ (0, 1, 2, 3, 4, 5) generated by the signal coding unit 12b-2 into an analog signal. The DA conversion unit 13b-2 outputs the analog signal to the amplification unit 14b-2.

The amplification units 14b amplify the signal power of the analog signals output from the DA conversion units 13b, and apply the amplified signal power to the optical vector modulator 17. Specifically, the amplification unit 14b-1 amplifies the signal power of the analog signal output from the DA conversion unit 13b-1, and applies the amplified signal power to the optical vector modulator 17. The amplification unit 14b-2 amplifies the signal power of the analog signal output from the DA conversion unit 13b-2, and applies the amplified signal power to the optical vector modulator 17.

The signal light source 15 emits continuous light to the optical vector modulator 17.

The optical vector modulator 17 independently performs amplitude modulation with the analog signals output from the respective amplification units 14b-1 and 14b-2. Specifically, the optical vector modulator 17 performs amplitude modulation on an In-phase component of the continuous light emitted from the signal light source 15 with the analog signal output from the amplification unit 14b-1. The optical vector modulator 17 performs amplitude modulation on a Quadrature component of the continuous light emitted from the signal light source 15 with the analog signal output from the amplification unit 14b-2. As a result of the optical vector modulator 17 modulating the continuous light emitted from the signal light source 15 in this way, the optical vector modulator 17 generates a 36-value optical complex amplitude-modulated signal (NLTCQ signal). If the probability is denoted by $r_{ij}$ where i is the value of the In-phase component, and j is the value of the Quadrature component, $r_{ij}=s_i \times s_j$ is satisfied. Here, $s_n$ (n=0, 1, 2, 3, 4, 5) is the probability that each component takes the value "n". Accordingly, a 6×6 matrix R with the elements $r_{ij}$ is given by Expression 13 below.

[Formula 13]

$$R = \begin{pmatrix} 1/256 & 3/256 & 4/256 & 4/256 & 3/256 & 1/256 \\ 3/256 & 9/256 & 12/256 & 12/256 & 9/256 & 3/256 \\ 4/256 & 12/256 & 16/256 & 16/256 & 12/256 & 4/256 \\ 4/256 & 12/256 & 16/256 & 16/256 & 12/256 & 4/256 \\ 3/256 & 9/256 & 12/256 & 12/256 & 9/256 & 3/256 \\ 1/256 & 3/256 & 4/256 & 4/256 & 3/256 & 1/256 \end{pmatrix} \quad \text{(Expression 13)}$$

The optical receiver 20b includes AD conversion units 22b-1 and 22b-2, a digital signal processing unit 23b, a local light source 24, and a coherent receiver 25.

The local light source 24 outputs local light that is to interfere with received signal light.

The coherent receiver 25 performs coherent detection on the NLTCQ signal transmitted from the optical transmitter 10b based on the local light, and thereby outputs complex amplitude information regarding the NLTCQ signal. Here, the complex amplitude information regarding the NLTCQ signal refers to an analog electrical signal of the I component and an analog electrical signal of the Q component.

The AD conversion units 22b convert the analog electrical signals output from the coherent receiver 25 into digital signals. Specifically, the AD conversion unit 22b-1 converts the analog electrical signal of the I component into a digital signal. The AD conversion unit 22b-2 converts the analog electrical signal of the Q component into a digital signal.

The digital signal processing unit 23b processes the digital signals to acquire $ui_n$ and $uq_n$ that are the symbols before the nonlinear trellis coding.

Figure 10:
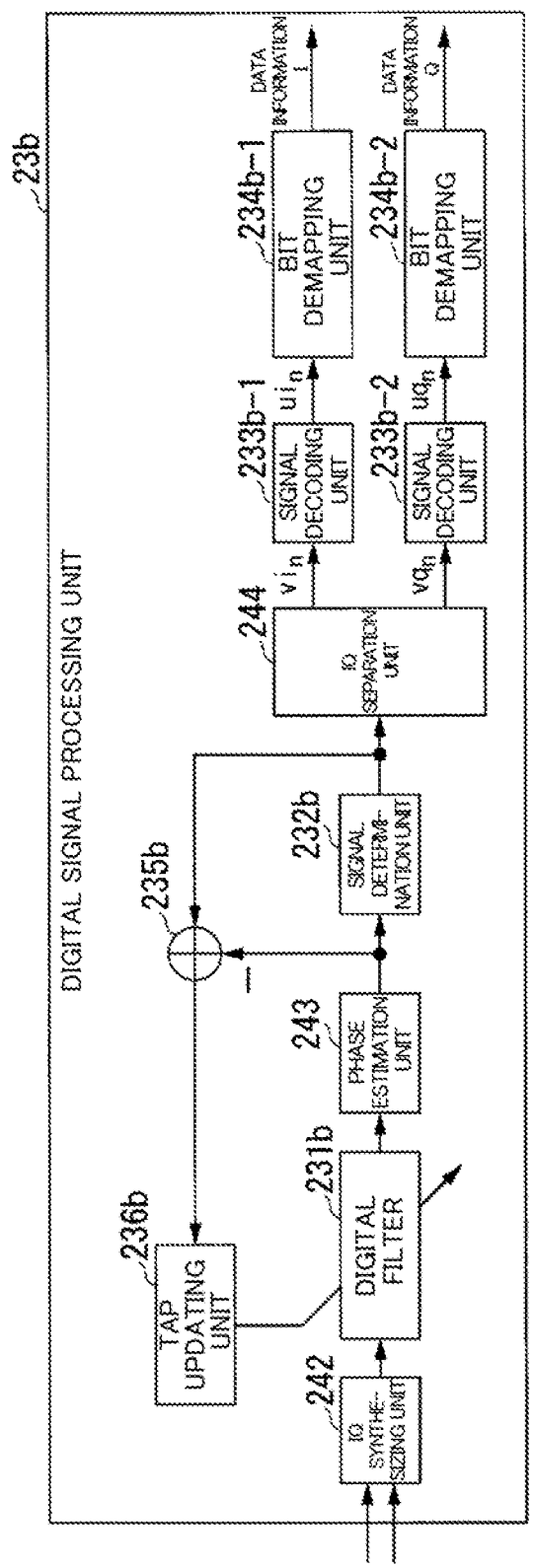
FIG. 10 is a diagram illustrating an internal configuration of a digital signal processing unit according to the fourth embodiment.

FIG. 10 is a diagram showing an internal configuration of the digital signal processing unit 23b of the fourth embodiment.

The digital signal processing unit 23b includes a digital filter 231b, a signal determination unit 232b, signal decoding units 233b-1 and 233b-2, bit demapping units 234b-1 and 234b-2, an adder 235b, a tap updating unit 236b, an IQ synthesizing unit 242, a phase estimation unit 243, and an IQ separation unit 244.

The IQ synthesizing unit 242 incorporates the digital signals output from the AD conversion units 22b-1 and 22b-2 as a real part (digital signal of an I channel component) and an imaginary part (digital signal of a Q channel component), respectively. The IQ synthesizing unit 242 synthesizes the incorporated signals into a complex signal. Specifically, the IQ synthesizing unit 242 incorporates the digital signal output from the AD conversion unit 22b-1 as a real part, and the digital signal output from the AD conversion unit 22b-2 as an imaginary part, and synthesizes the incorporated signals into a complex signal.

The digital filter 231b is constituted by a complex tap, and performs waveform shaping on the NLTCQ signal. The digital filter 231b outputs the waveform-shaped NLTCQ signal to the phase estimation unit 243. As the digital filter 231b, a typical linear filter such as a FIR filter, or a Volterra filter that can describe a high-order transfer function is used.

The phase estimation unit 243 compensates for a phase difference between the signal light and the local light emitted by the local light source 24. The phase estimation unit 243 outputs the signal (NLTCQ signal) obtained by the compensation to the signal determination unit 232b and the adder 235b.

The signal determination unit 232b subjects the NLTCQ signal, serving as a 36-value QAM signal, to threshold determination. The signal determination unit 232b outputs the signal obtained through the threshold determination to the adder 235b and the IQ separation unit 244.

The IQ separation unit 244 separates the signal output from the signal determination unit 232b into the real part (digital signal of the I channel component) and the imaginary part (digital signal of the Q channel component), and thereby acquires two systems of 6-value symbols $vi_n$ and $vq_n$. The IQ separation unit 244 outputs the acquired 6-value symbol $vi_n$ to the signal decoding unit 233b-1, and outputs the 6-value symbol $vq_n$ to the signal decoding unit 233b-2.

The signal decoding units 233b execute the processing based on Expression 6, using the 6-value symbols $vi_n$ and $vq_n$ output from the IQ separation unit 244 and already determined 6-value symbols $vi_{n-1}$ and $vq_{n-1}$ in the previous time slot, and thereby reconstruct $ui_n$ and $uq_n$ that are the 4-value symbols before the coding. Specifically, the signal decoding unit 233b-1 executes the processing based on Expression 6, using the 6-value symbol $vi_n$ output from the IQ separation unit 244 and the already determined 6-value symbol $vi_{n-1}$ in the previous time slot, and thereby reconstructs $ui_n$ that is the 4-value symbol before the coding. Also, the signal decoding unit 233b-2 executes the processing based on Expression 6, using the 6-value symbol $vq_n$ output from the IQ separation unit 244 and the already determined 6-value symbol $vq_{n-1}$ in the previous time slot, and thereby reconstructs $uq_n$ that is the 4-value symbol before the coding.

Note however that the signal decoding unit 233b-1 sets $ui_n$ obtained by Expression 6 to 0 if $ui_n<0$ is satisfied, and sets $ui_n$ to 3 if $ui_n>3$ is satisfied. Also, the signal decoding unit 233b-2 sets $uq_n$ obtained by Expression 6 to 0 if $uq_n<0$ is satisfied, and sets $uq_n$ to 3 if $uq_n>3$ is satisfied.

The bit demapping units 234b perform gray decoding on $ui_n$ and $uq_n$ that are the 4-value symbols reconstructed by the signal decoding units 233b, and thereby reconstruct the pieces of data information I and Q, which are bit information, from $ui_n$ and $uq_n$. Specifically, the bit demapping unit 234b-1 performs gray decoding on $ui_n$ that is the 4-value symbol reconstructed by the signal decoding unit 233b-1, and thereby reconstructs the data information I, which is bit information, from $ui_n$. The bit demapping unit 234b-2 performs gray decoding on $uq_n$ that is the 4-value symbol reconstructed by the signal decoding unit 233b-2, and thereby reconstructs data information Q, which is bit information, from $uq_n$.

The adder 235b incorporates the value output from the phase estimation unit 243 and the value output from the signal determination unit 232b. Note that the adder 235b gives the minus sign to the value output from the phase estimation unit 243, and incorporates the value. The adder 235b adds up the two incorporated values, that is, subtracts the value output from the phase estimation unit 243 from the value output from the signal determination unit 232b, and outputs the subtraction result obtained by the subtraction to the tap updating unit 236b.

The tap updating unit 236b updates the tap coefficient of the digital filter 231b based on the difference between the value after the determination of the signal determination unit 232b and the value before the determination of the signal determination unit 232b. Specifically, the tap updating unit 236b updates the tap coefficient of the digital filter 231b so that the difference between the value output from the phase estimation unit 243 and the value output from the signal determination unit 232b is minimum, that is, the subtraction result is 0. Accordingly, the accuracy of the demodulation is improved.

Figure 11:
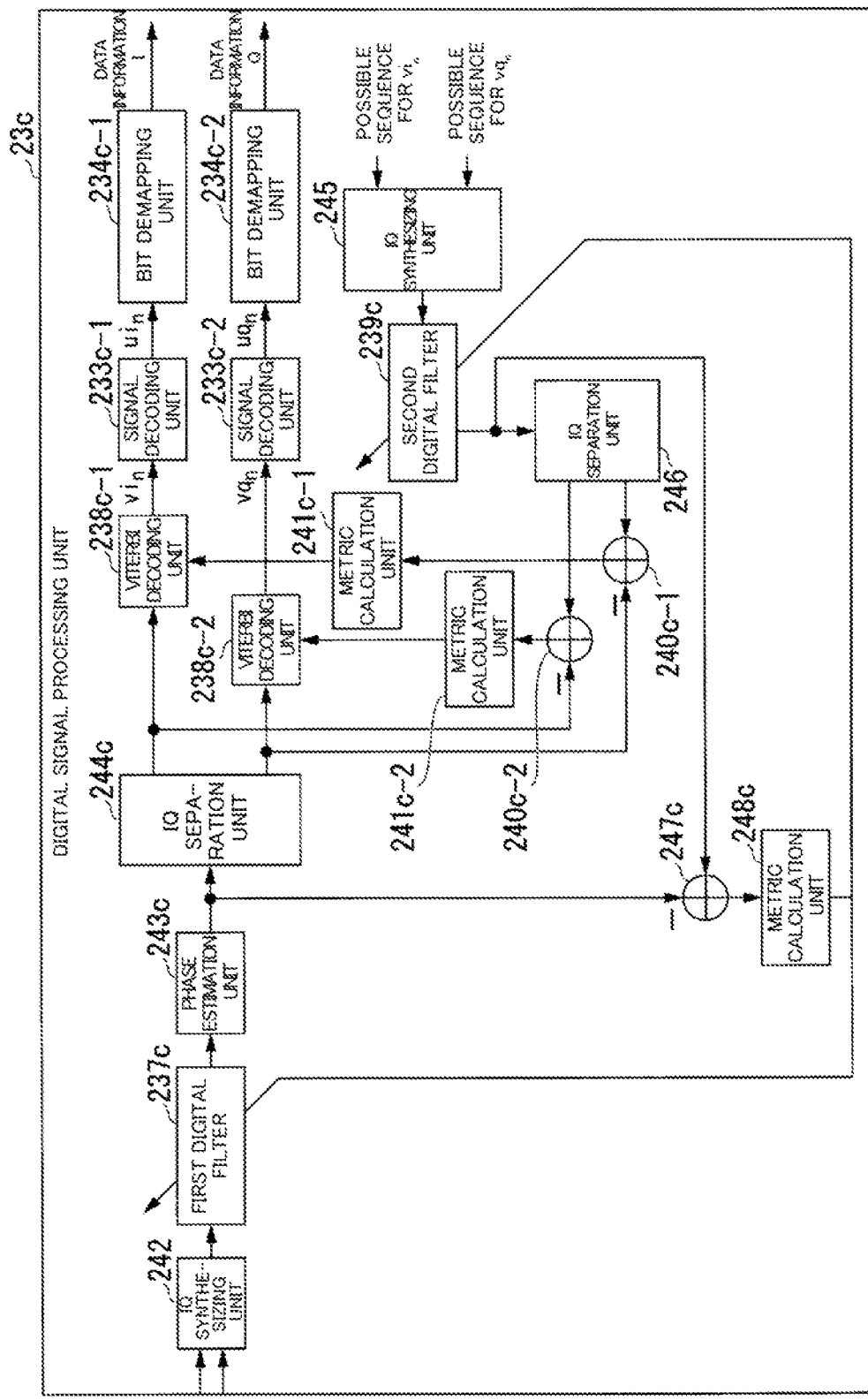
FIG. 11 is a diagram illustrating the internal configuration of the digital signal processing unit when symbol determination is performed through Viterbi decoding according to the fourth embodiment.

The following describes a configuration of a digital signal processing unit when symbol determination is performed using Viterbi decoding with reference to FIG. 11. FIG. 11 is a diagram showing an internal configuration of a digital signal processing unit 23c when symbol determination is performed using Viterbi decoding in the fourth embodiment.

The digital signal processing unit 23c includes signal decoding units 233c-1 and 233c-2, bit demapping units 234c-1 and 234c-2, a first digital filter 237c, Viterbi decoding units 238c-1 and 238c-2, a second digital filter 239c, adders 240c-1 and 240c-2, metric calculation units 241c-1 and 241c-2, the IQ synthesizing unit 242, a phase estimation unit 243c, an IQ synthesizing unit 245, an IQ separation unit 246, an adder 247, and a metric calculation unit 248.

The first digital filter 237c is constituted by a complex tap, and performs waveform shaping on the NLTCQ signal. The first digital filter 237c outputs the waveform-shaped NLTCQ signal to the phase estimation unit 243c. As the first digital filter 237c, a typical linear filter such as a FIR filter or a Volterra filter is used.

The phase estimation unit 243c compensates for a phase difference between the signal light and the local light emitted by the local light source 24. The phase estimation unit 243c outputs the signal (NLTCQ signal) obtained by the compensation to the IQ separation unit 244c and the adder 247c.

The IQ separation unit 244c separates the signal output from the phase estimation unit 243c into a real part (digital signal of the I channel component) and an imaginary part (digital signal of the Q channel component). The IQ separation unit 244c outputs the signal of the I channel component to the Viterbi decoding unit 238c-1 and the adder 240c-2, and outputs the signal of the Q channel component to the Viterbi decoding unit 238c-2 and the adder 240c-1.

The Viterbi decoding units 238c perform sequence estimation on the 6-value symbols $vi_n$ and $vq_n$, based on the signals output from the IQ separation unit 244c and the metrics output from the metric calculation units 241c. Specifically, the Viterbi decoding unit 238c-1 performs, using a Viterbi algorithm, sequence estimation on the 6-value symbol $vi_n$ of the I channel component, based on the signal that corresponds to the real part (I channel component) and the metric output from the metric calculation unit 241c-1. The Viterbi decoding unit 238c-1 employs the symbol sequence having the smallest metric, out of metrics obtained as a result of the sequence estimation, as a transmission sequence $vi_n$. One example of the metric output from the metric calculation unit 241c-1 is a Euclidean distances between an imaginary component of time-series data that is obtained by the IQ synthesizing unit 245 synthesizing conceivable possible sequences (possible sequences) for $vi_n$ and $vq_n$ into a complex number, and the second digital filter 239c performing digital filtering processing, and an imaginary component of time-series data output from the first digital filter 237c.

Also, the Viterbi decoding unit 238c-2 performs, using a Viterbi algorithm, sequence estimation on the 6-value symbol $vi_n$ of the Q channel component, based on the signal that corresponds to the imaginary part (Q channel component) and the metric output from the metric calculation unit 241c-2. The Viterbi decoding unit 238c-2 employs the symbol sequence having the smallest metric, out of metrics obtained as a result of the sequence estimation, as a transmission sequence $vq_n$. One example of the metric output from the metric calculation unit 241c-2 is a Euclidean distance between a real component of time-series data that is obtained by the IQ synthesizing unit 245 synthesizing conceivable possible sequences (possible sequences) for $vi_n$ and $vq_n$ into a complex number, and the second digital filter 239c performing digital filtering processing, and a real component of time-series data output from the first digital filter 237c.

The signal decoding units 233c reconstruct, from the transmission sequences $vi_n$ and $vq_n$ employed by the Viterbi decoding units 238c, $ui_n$ and $uq_n$ that are the symbols before the nonlinear trellis coding by applying Expression 6 to $vi_n$ and $vq_n$. Specifically, the signal decoding unit 233c-1 reconstructs, from the transmission sequence $vi_n$ employed by the Viterbi decoding unit 238c-1, $vq_n$ that is the symbol before the nonlinear trellis coding by applying Expression 6 to vie. The signal decoding unit 233c-2 reconstructs, from the transmission sequence $vq_n$ employed by the Viterbi decoding unit 238c-2, $uq_n$ that is the symbol before the nonlinear trellis coding by applying Expression 6 to $vq_n$.

The bit demapping units 234c perform gray decoding on $ui_n$ and $uq_n$ that are the 4-value symbols reconstructed by the signal decoding units 233c, and thereby reconstruct the pieces of data information I and Q, which are bit information, from $ui_n$ and $uq_n$. Specifically, the bit demapping unit 234c-1 perform gray decoding on $ui_n$ that is the 4-value symbol reconstructed by the signal decoding unit 233c-1, and thereby reconstructs the data information I, which is bit information, from $ui_n$. The bit demapping unit 234c-2 perform gray decoding on $uq_n$ that is the 4-value symbol reconstructed by the signal decoding unit 233c-2, and thereby reconstructs the data information Q, which is bit information, from $uq_n$.

The IQ synthesizing unit 245 synthesizes conceivable possible sequences (possible sequences) for the input $vi_n$ and $vq_n$ into a complex number.

The second digital filter 239c is constituted by a complex tap, and acquires time-series data by performing digital filtering processing on the complex number synthesized by the IQ synthesizing unit 245. The second digital filter 239c outputs the acquired time-series data to the IQ separation unit 246 and the adder 247c. As the second digital filter 239c, a typical linear filter such as a FIR filter or a Volterra filter is used. In particular, a Volterra filter is preferably used as the second digital filter 239c when the system has a large nonlinear response.

The IQ separation unit 246 separates the signal output from the second digital filter 239c into a real part and an imaginary part. The IQ separation unit 246 outputs the signal corresponding to the real part (signal of the I channel component) to the adder 240c-2, and outputs signal corresponding to the imaginary part (signal of the Q channel component) to the adder 240c-1.

The adder 247c incorporates the value output from the phase estimation unit 243c and the value output from the second digital filter 239c. Note that the adder 247c gives the minus sign to the value output from the phase estimation unit 243c, and incorporates the value. The adder 247c adds up the two incorporated values, that is, subtracts the value output from the phase estimation unit 243c from the value output from the second digital filter 239c, and outputs the subtraction result obtained by the subtraction to the metric calculation unit 248c.

The metric calculation unit 248c calculates the subtraction result output from the adder 247c as a metric.

The adder 240c-1 incorporates the value (signal of the Q channel component) output from the IQ separation unit 246, and the value (signal of the Q channel component) output from the IQ separation unit 244c. Note that the adder 240c-1 gives the minus sign to the value output from the IQ separation unit 244c, and incorporates the value. The adder 240c-1 adds up the two incorporated values, that is, subtracts the value output from the phase estimation unit 243c from the value output from the IQ separation unit 246, and outputs the subtraction result obtained by the subtraction to the metric calculation unit 241c-1.

The adder 240c-2 incorporates the value (signal of the I channel component) output from the IQ separation unit 246, and the value (signal of the I channel component) output from the IQ separation unit 244c. Note that the adder 240c-2 gives the minus sign to the value output from the IQ separation unit 244c, and incorporates the value. The adder 240c-2 adds up the two incorporated values, that is, subtracts the value output from the phase estimation unit 243c from the value output from the IQ separation unit 246, and outputs the subtraction result obtained by the subtraction to the metric calculation unit 241c-2.

The metric calculation unit 241c-1 calculates the subtraction result output from the adder 240c-1 as a metric.

The metric calculation unit 241c-2 calculates the subtraction result output from the adder 240c-2 as a metric.

According to the optical transmission system 100b of the fourth embodiment that has the above-described configurations, the present invention is also applicable to a coherent detection method.

Fifth Embodiment

The present invention is applicable to a QAM signal that has a suitable multi-value symbol. Accordingly, a fifth embodiment describes a configuration in which the nonlinear trellis coding of the present invention is applied to a $N^2$-value QAM signal.

The configurations of an optical transmitter and an optical receiver according to the fifth embodiment are the same as those in the fourth embodiment.

First, the configuration of the optical transmitter 10b according to the fifth embodiment is described.

The signal generation units 11b input, from the outside, data information that is to be transmitted, and generate two systems of Gray-coded N-value symbols based on the input data information. Specifically, the signal generation unit 11b-1 inputs, from the outside, data information I that is to be transmitted, and generates a Gray-coded N-value symbol $ui_n$ (0, 1, . . . , N−1) based on the input data information I. The signal generation unit 11b-2 inputs, from the outside, data information Q that is to be transmitted, and generates a Gray-coded N-value symbol $uq_n$(0, 1, . . . , N−1) based on the input data information Q.

The signal coding units 12b perform nonlinear trellis coding processing on the N-value symbols $ui_n$ (0, 1, . . . , N−1) and $uq_n$ (0, 1, . . . , N−1) generated by the signal generation unit 11b, and thereby generate two systems of N+2-value symbols. Specifically, the signal coding unit 12b-1 performs the nonlinear trellis coding processing given by Expressions 7 to 9 above on the N-value symbol $ui_n$ (0, 1, N−1) to generate an N+2-value symbol $vi_n$ (0, 1, . . . , N+1). The signal coding unit 12b-2 performs the nonlinear trellis coding processing given by Expressions 7 to 9 above on the N-value symbol $uq_n$ (0, 1, . . . , N−1) to generate an N+2-value symbol $vq_n$ (0, 1, . . . , N+1).

The DA conversion unit 13b convert the digital signals of the N+2-value symbols $vi_n$ (0, 1, . . . , N+1) and $vq_n$ (0, 1, . . . , N+1) generated by the signal coding units 12b into analog signals. Specifically, the DA conversion unit 13b-1 converts the digital signal of the N+2-value symbol $vi_n$ (0, 1, . . . , N+1) generated by the signal coding unit 12b-1 into an analog signal. The DA conversion unit 13b-1 outputs the analog signal to the amplification unit 14b-1. The DA conversion unit 13b-2 converts the digital signal of the $vq_n$ (0, 1, . . . , N+1) generated by the signal coding unit 12b-2 into an analog signal. The DA conversion unit 13b-2 outputs the analog signal to the amplification unit 14b-2.

The amplification units 14b amplify the signal power of the analog signals output from the DA conversion units 13b, and apply the amplified signal power to the optical vector modulator 17. Specifically, the amplification unit 14b-1 amplifies the signal power of the analog signal output from the DA conversion unit 13b-1, and applies the amplified signal power to the optical vector modulator 17. The amplification unit 14b-2 amplifies the signal power of the analog signal output from the DA conversion unit 13b-2, and applies the amplified signal power to the optical vector modulator 17.

The signal light source 15 emits continuous light to the optical vector modulator 17.

The optical vector modulator 17 independently performs amplitude modulation with the analog signals output from the amplification unit 14b-1 and 14b-2. Specifically, the optical vector modulator 17 performs amplitude modulation on an In-phase component of the continuous light emitted from the signal light source 15 with analog signal output from the amplification unit 14b-1. The optical vector modulator 17 performs amplitude modulation on a Quadrature component of the continuous light emitted from the signal light source 15 with the analog signal output from the amplification unit 14b-2. As a result of the optical vector modulator 17 modulating the continuous light emitted from the signal light source 15 in this way, the optical vector modulator 17 generates a $(N+2)^2$-value optical complex amplitude-modulated signal (NLTCQ signal).

Next, the configuration of the optical receiver 20b of the fifth embodiment is described.

The local light source 24 outputs local light that is to interfere with received signal light.

The coherent receiver 25 performs coherent detection on the NLTCQ signal transmitted from the optical transmitter 10b based on the local light, and thereby outputs complex amplitude information regarding the NLTCQ signal. Here, the complex amplitude information regarding the NLTCQ signal refers to an analog electrical signal of the I component and an analog electrical signal of the Q component.

The AD conversion units 22b convert the analog electrical signals output from the coherent receiver 25 into digital signals. Specifically, the AD conversion unit 22b-1 converts the analog electrical signal of the I component into a digital signal. The AD conversion unit 22b-2 converts the analog electrical signal of the Q component into a digital signal.

The digital signal processing unit 23b processes the digital signal to acquire $ui_n$ and $uq_n$ that are the symbols before the nonlinear trellis coding.

The configuration of the digital signal processing unit 23b is the same as that of the fourth embodiment.

The IQ synthesizing unit 242 incorporates the digital signals output from the AD conversion units 22b-1 and 22b-2 as a real part and an imaginary part, respectively. The IQ synthesizing unit 242 synthesizes the incorporated signals into a complex signal. Specifically, the IQ synthesizing unit 242 incorporates the digital signal output from the AD conversion unit 22b-1 as a real part, and the digital signal output from the AD conversion unit 22b-2 as an imaginary part, and synthesizes the incorporated signals into a complex signal.

The digital filter 231*b* is constituted by a complex tap, and performs waveform shaping on the NLTCQ signal. The digital filter 231*b* outputs the waveform-shaped NLTCQ signal to the phase estimation unit 243. As the digital filter 231*b*, a typical linear filter such as a FIR filter, or a Volterra filter that can describe a high-order transfer function is used.

The phase estimation unit 243 compensates for a phase difference between the signal light and the local light emitted by the local light source 24. The phase estimation unit 243 outputs the signal (NLTCQ signal) obtained by the compensation to the signal determination unit 232*b* and the adder 235*b*.

The signal determination unit 232*b* subjects the NLTCQ signal, serving as a $(N+2)^2$-value QAM signal, to threshold determination. The signal determination unit 232*b* outputs the signal obtained through the threshold determination to the adder 235*b* and the IQ separation unit 244.

The IQ separation unit 244 separates the signal output from the signal determination unit 232*b* into the real part and the imaginary part, and thereby acquires two systems of N+2-value symbols $vi_n$ and $vq_n$. The IQ separation unit 244 outputs the acquired N+2-value symbol $vi_n$ to the signal decoding unit 233*b*-1, and outputs the N+2-value symbol $vq_n$ to the signal decoding unit 233*b*-2.

The signal decoding units 233*b* execute the processing based on Expressions 10 to 12, using the N+2-value symbols $vi_n$ and $vq_n$ output from the IQ separation unit 244 and already determined N+2-value symbols $vi_{n-1}$ and $vq_{n-1}$ in the previous time slot, and thereby reconstruct $ui_n$ and $uq_n$ that are the N-value symbols before the coding. Specifically, the signal decoding unit 233*b*-1 executes the processing based on Expressions 10 to 12, using the N+2-value symbol $vi_n$ output from the IQ separation unit 244 and the already determined N+2-value symbol $vi_{n-1}$ in the previous time slot, and thereby reconstructs $ui_n$ that is the N-value symbol before the coding. Also, the signal decoding unit 233*b*-2 executes the processing based on Expressions 10 to 12, using the N+2-value symbol $vq_n$ output from the IQ separation unit 244 and the already determined N+2-value symbol $vq_{n-1}$ in the previous time slot, and thereby reconstructs $uq_n$ that is the N-value symbol before the coding.

Note however that the signal decoding unit 233*b*-1 sets $ui_n$ obtained by Expressions 10 to 12 to 0 if $ui_n<0$ is satisfied, and sets $ui_n$ to N−1 if $ui_n>N-1$ is satisfied. Also, the signal decoding unit 233*b*-2 sets $uq_n$ obtained by Expressions 10 to 12 to 0 if $uq_n<0$ is satisfied, and sets the $uq_n$ to N−1 if $uq_n>N-1$ is satisfied.

The bit demapping units 234*b* perform gray decoding on $ui_n$ and $uq_n$ that are the N-value symbols reconstructed by the signal decoding units 233*b*, and thereby reconstruct the pieces of data information I and Q, which are bit information, from $ui_n$ and $uq_n$. Specifically, the bit demapping unit 234*b*-1 performs gray decoding on $ui_n$ that is the N-value symbol reconstructed by the signal decoding unit 233*b*-1, and thereby reconstructs the data information I, which is bit information, from $ui_n$. The bit demapping unit 234*b*-2 performs gray decoding on $uq_n$ that is the N-value symbol reconstructed by the signal decoding unit 233*b*-2, and thereby reconstructs the data information Q, which is bit information, from $uq_n$.

According to the optical transmission system 100*b* of the fifth embodiment that has the above-described configurations, the present invention is also applicable to suitable multi-value QAM.

Some or all of the functions of the optical transmitters 10 and 10*b* and the optical receivers 20 and 20*b* according to the above-described embodiments may be realized by a computer. In such a case, a program for realizing the functions may be recorded in a computer-readable recording medium, and the functions may be realized by loading the program recorded on this recording medium to a computer system, and executing the program. Note that the "computer system" used herein includes an OS and hardware such as peripheral devices. Also, the "computer-readable recording medium" refers to a portable medium such as a flexible disk, a magneto-optical disk, a ROM, or a CD-ROM, or a storage device built in the computer system, such as a hard disk. Furthermore, examples of the "computer-readable recording medium" include a medium that dynamically holds the program for a short period of time, like a communication line when transmitting the program through a network such as the Internet or a communication line such as a telephone line, and a medium that holds the program for a certain period of time like a volatile memory in a computer system that serves as a server or a client in that case. Also, the above-described program may be a program for realizing some of the aforementioned functions, a program that can realize the aforementioned functions in combination with a program that has already been recorded in the computer system, or a program that is realized using a programmable logic device such as a FPGA (Field Programmable Gate Array).

Although the embodiments of the present invention have been described in detail with reference to the drawings, a specific configuration is not limited to the embodiments, and design or the like made without departing from the spirit of the invention is also included in the scope of the invention.

REFERENCE SIGNS LIST 10, 10*b* Optical transmitter
11, 11*b*-1, 11*b*-2 Signal generation unit
12, 12*b*-1, 12*b*-2 Signal coding unit
13, 13*b*-1, 13*b*-2 DA conversion unit
14, 14*b*-1, 14*b*-2 Amplification unit
15 Signal light source
16 Optical modulator
17 Optical vector modulator
20, 20*b* Optical receiver
21 Light receiving unit
22, 21*b*-1, 21*b*-2 AD conversion unit
23, 23*a*, 23*b*, 23*c* Digital signal processing unit
24 Local light source
25 Coherent receiver
231, 231*b* Digital filter
232, 232*b* Signal determination unit
233, 233*a*, 233*b*-1, 233*b*-2 Signal decoding unit
234, 234*b*-1, 234*b*-2 Bit demapping unit
235, 235*b* Adder
236, 236*b* Tap updating unit
237, 237*c* First digital filter
238, 238*c*-1, 238*c*-2 Viterbi decoding unit
239, 239*c* Second digital filter
240, 240*c*-1, 240*c*-2 Adder
241, 241*c*-1, 241*c*-2 Metric calculation unit
242 IQ synthesizing unit
243, 243*c* Phase estimation unit
244, 244*c* IQ separation unit
245 IQ synthesizing unit
246 IQ separation unit
247, 247*c* Adder
248 Metric calculation unit

The invention claimed is:

1. An optical transmission system comprising:
an optical transmitter, the optical transmitter including:
a signal generation unit configured to generate, using input information data, an N-value symbol that is Gray-coded, the N being an integer of 2 or greater;
a signal coding unit configured to perform nonlinear trellis coding, which corresponds to nonlinear calculation, on the N-value symbol to generate an N+2-value symbol; and
a modulator configured to modulate the N+2-value symbol and transmit an optical signal corresponding to the N+2-value symbol to an optical receiver, and
the optical receiver, the optical receiver including:
a light receiving unit configured to receive the optical signal and convert the received optical signal into an electrical signal; and
a digital signal processing unit configured to perform digital signal processing on the electrical signal to reconstruct the N+2-value symbol.

2. The optical transmission system according to claim 1, wherein the optical receiver further includes a Viterbi decoding unit configured to perform symbol determination based on sequence estimation using Viterbi decoding when the electrical signal is demodulated.

3. The optical transmission system according to claim 1, wherein the signal coding unit is configured to perform the nonlinear trellis coding given by Expressions 1 to 3 below to generate the N+2-value symbol,
the digital signal processing unit is configured to perform predetermined determination on the electrical signal to reconstruct the N+2-value symbol, and
the digital signal processing unit is configured to reconstruct the N-value symbol before the nonlinear trellis coding, based on Expressions 4 to 6 below, using the reconstructed N+2-value symbol and an already determined N+2-value symbol in a previous time slot, wherein the Expressions 1 to 6 are defined as:

the Expression 1 is $v_n = u_n (v_{n-1} < N/2)$;

the Expression 2 is $v_n = u_n + 1 (N/2 \le v_{n-1} < (N/2)+2)$;

the Expression 3 is $v_n = u_n + 2 ((N/2)+2 \le v_{n-1})$;

the Expression 4 is $u_n = v_n (v_{n-1} < N/2)$;

the Expression 5 is $u_n = v_n - 1 (N/2 \le v_{n-1} < (N/2)+2)$;

and the Expression 6 is $u_n = v_n - 2 ((N/2)+2 \le v_{n-1})$.

4. The optical transmission system according to claim 3, wherein the digital signal processing unit is configured to perform symbol determination based on sequence estimation using Viterbi decoding as the predetermined determination on the electrical signal.

5. The optical transmission system according to claim 1, wherein the signal generation unit is configured to generate two systems of the N-value symbols,
the signal coding unit is configured to perform the nonlinear trellis coding given by Expressions 7 to 9 below to generate two systems of the N+2-value symbols,
the digital signal processing unit is configured to perform predetermined determination on the electrical signal to reconstruct the two systems of the N+2-value symbols, and
the digital signal processing unit is configured to reconstruct the N-value symbols before the nonlinear trellis coding, based on Expressions 10 to 12 below, using a plurality of reconstructed N+2-value symbols and a plurality of already determined N+2-value symbols in a previous time slot, wherein the Expressions 7 to 12 are defined as:

the Expression 7 is $v_n = u_n (v_{n-1} < N/2)$;

the Expression 8 is $v_n = u_n + 1 (N/2 \le v_{n-1} < (N/2)+2)$;

the Expression 9 is $v_n = u_n + 2 ((N/2)+2 \le v_{n-1})$;

the Expression 10 is $u_n = v_n (v_{n-1} < N/2)$;

the Expression 11 is $u_n = v_n - 1 (N/2 \le v_{n-1} < (N/2)+2)$;

and the Expression 12 is $u_n = v_n - 2 ((N/2)+2 \le v_{n-1})$.

6. The optical transmission system according to claim 5, wherein the digital signal processing unit is configured to perform symbol determination based on sequence estimation using Viterbi decoding as the predetermined determination on the electrical signal.

* * * * *